US010564373B1

(12) United States Patent
Ogden et al.

(10) Patent No.: US 10,564,373 B1
(45) Date of Patent: Feb. 18, 2020

(54) INTERFEROMETRIC IMAGING SYSTEMS WITH EXCHANGEABLE IMAGING MODULES

(71) Applicant: Lockheed Martin Corporation, Bethesda, MD (US)

(72) Inventors: Chad E. Ogden, Half Moon Bay, CA (US); Guy Chriqui, San Mateo, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 79 days.

(21) Appl. No.: 15/875,971

(22) Filed: Jan. 19, 2018

Related U.S. Application Data

(60) Provisional application No. 62/448,331, filed on Jan. 19, 2017.

(51) Int. Cl.
| | |
|---|---|
| *G02B 6/42* | (2006.01) |
| *H04N 5/225* | (2006.01) |
| *G02B 6/32* | (2006.01) |
| *G01B 9/02* | (2006.01) |

(52) U.S. Cl.
CPC ....... *G02B 6/4298* (2013.01); *G01B 9/02051* (2013.01); *G02B 6/32* (2013.01); *H04N 5/2253* (2013.01); *H04N 5/2254* (2013.01); *H04N 5/2257* (2013.01); *H04N 5/2258* (2013.01)

(58) Field of Classification Search
CPC ..... H01L 27/14627; G02B 23/26; G02B 6/08; G02B 6/4298; G01B 9/02051
See application file for complete search history.

(56) References Cited

U.S. PATENT DOCUMENTS

| | | | |
|---|---|---|---|
| 6,722,792 B2 | 4/2004 | Raj et al. | |
| 8,913,859 B1* | 12/2014 | Duncan | G02B 6/06 356/477 |
| 8,923,670 B2 | 12/2014 | Zbinden et al. | |
| 9,754,985 B1 | 9/2017 | Duncan et al. | |
| 2006/0141649 A1 | 6/2006 | Joyner et al. | |
| 2008/0226228 A1* | 9/2008 | Tamura | G02B 6/4214 385/33 |
| 2010/0309288 A1* | 12/2010 | Stettner | G01S 17/023 348/43 |

(Continued)

OTHER PUBLICATIONS

Ryan Scott, Demonstration of a Photonic Integrated Circuit for Multi-baseline Interferometric Imaging, 2014, IEEE Photonic Conference (Year: 2014).*

*Primary Examiner* — Michael P LaPage
(74) *Attorney, Agent, or Firm* — Morgan, Lewis & Bockius LLP

(57) ABSTRACT

A modular assembly for an imaging system can allow precision alignment to occur in isolated manufacturing stages, with the separate components being assembled together in later stages. An exemplary system includes a support structure, multiple imaging modules exchangeably coupled to the support structure and each including lenslets and a photonic integrated circuit (PIC) device arranged to receive light from the lenslets, multiple fiber arrays each connected to corresponding one of the multiple imaging modules, and a camera system connected to the fiber arrays. The lenslets the PIC device can be integrally coupled prior to assembly with the support structure, so that precise alignment of the lenslets with respect to the PIC device is performed in isolation.

18 Claims, 9 Drawing Sheets

(56) References Cited

U.S. PATENT DOCUMENTS

| | | |
|---|---|---|
| 2014/0086527 A1 | 3/2014 | Ban |
| 2014/0126902 A1* | 5/2014 | Swanson .................. H04J 14/00 398/43 |
| 2016/0091368 A1* | 3/2016 | Fish ........................ G01J 3/108 356/328 |

* cited by examiner

INTERFEROMETRIC IMAGING SYSTEMS WITH EXCHANGEABLE IMAGING MODULES

CROSS-REFERENCES TO RELATED APPLICATION

This application claims the benefit of U.S. Provisional Application No. 62/448,331, entitled "MONOLITHIC COLLIMATOR ARRAY," filed Jan. 19, 2017, the entirety of which is incorporated herein by reference.

STATEMENT REGARDING FEDERALLY SPONSORED RESEARCH OR DEVELOPMENT

Not applicable.

TECHNICAL FIELD

The present description relates in general to imaging devices and methods of manufacture, and in particular to, for example, without limitation, inferometric imaging systems that include photonic integrated circuits (PICs).

BACKGROUND OF THE DISCLOSURE

Traditional electro-optical imaging payloads include an optical telescope to collect the light from the object scene and map the photons to an image plane to be digitized by a focal plane detector array. The size, weight, and power (SWaP) for the traditional imager is dominated by the optical telescope, driven primarily by the large optics, large stiff structures, and the thermal control needed to maintain precision free-space optical alignments. These factors drive the cost, which scales in relation to the optical telescope aperture radius.

Conventional inferometric imaging devices generally include multiple PIC devices that receive and process light. The PIC devices provide signals that are used to generate images based on the incoming light. Imaging systems can utilize phased optical arrays with two-dimensional surfaces, thereby enabling the construction of flat-panel optical systems.

The description provided in the background section should not be assumed to be prior art merely because it is mentioned in or associated with the background section. The background section may include information that describes one or more aspects of the subject technology.

BRIEF SUMMARY OF THE DISCLOSURE

In accordance with various aspects of the present disclosure, inferometric imaging systems described herein can utilize flat, thin monolithic pre-aligned collimator arrays and PIC assemblies. Such imaging systems can reduce the size, weight, and power needs as compared to large person-size telescopes and complex combining optics traditionally utilized in space observation equipment. Furthermore, imaging systems described herein significantly reduce the time and cost traditionally required to create conventional collimator arrays and PIC assemblies.

Various examples of aspects of the disclosure are described below as clauses for convenience. These are provided as examples, and do not limit the subject technology.

Clause A. An imaging system including a support structure, multiple imaging modules exchangeably coupled to the support structure and each comprising lenslets and a photonic integrated circuit (PIC) device arranged to receive light from the lenslets, multiple fiber arrays each connected to corresponding one of the multiple imaging modules, and a camera system connected to the fiber arrays and configured to detect a signal from each of the multiple imaging modules via the fiber arrays.

Clause B. A method of manufacturing an imaging system, the method including providing a multiple imaging modules to a support structure, each of the multiple imaging modules comprising lenslets and a photonic integrated circuit (PIC) device, coupling each of the multiple imaging modules to the support structure, and connecting each PIC device to a corresponding fiber array connected to a camera system.

Clause C. A method of processing images with an imaging system, the method including receiving light at each of multiple imaging modules, each of the multiple imaging modules exchangeably coupled to a support structure and comprising lenslets and a photonic integrated circuit (PIC) device, processing the light with each PIC device, communicating a signal from each PIC device along fiber arrays to a camera system, and generating an image with the camera system and based on the signal.

Each of embodiments A, B, and C may have one or more of the following additional elements in any combination:

Element 1: at least a portion of each of the imaging modules is positioned within a corresponding receptacle of the support structure.

Element 2: each receptacle is defined within a corresponding extension member extending from a planar surface of the support structure.

Element 3: each of the multiple fiber arrays extends through the planar surface.

Element 4: the lenslets of the multiple imaging modules are arranged in a common plane.

Element 5: the multiple imaging modules are coupled to the support structure in a common plane.

Element 6: the lenslets of each of the multiple imaging modules are formed in a substrate that is integral with a corresponding one of the PIC devices.

Element 7: the lenslets are formed in a substrate that is integral with the PIC device.

Element 8: each of the fiber arrays is connected to the camera system along a corresponding row.

Element 9: the support structure comprises a converter for converting an analog signal from each PIC device to a digital signal.

Element 10: connecting each of the multiple imaging modules to the support structure comprises arranging the lenslets of the multiple imaging modules in a common plane.

Element 11: connecting each of the multiple imaging modules to the support structure comprises arranging the lenslets of the multiple imaging modules in a common plane.

Element 12: prior to the coupling, forming the lenslets of each of the multiple imaging modules in a substrate that is integral with the corresponding PIC device.

Element 13: the coupling comprises securing each of the multiple imaging modules within a corresponding receptacle defined within an extension member extending from a planar surface of the support structure.

Element 14: the connecting comprises positioning each fiber array through the planar surface.

Element 15: converting an analog signal from each PIC device to a digital signal with a converter of the support structure.

Element 16: the receiving comprises receiving the light through the lenslets, wherein the lenslets of each of the multiple imaging modules are formed in a substrate that is integral with a corresponding one of the PIC devices.

Element 17: the receiving comprises receiving the light through the lenslets arranged in a common plane.

The description in this summary section may provide some illustrative examples of the disclosure. This section is not intended to be a broad overview or to identify essential elements of the disclosure.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Optical imaging assemblies and methods of manufacture are described herein. Such devices and methods can incorporate aspects of interferometer imaging techniques. Imaging systems can utilize phased optical arrays with two-dimensional surfaces, thereby enabling the construction of flat-panel optical systems. Such systems have a lower cost profile based on size, weight, and power (SWaP) scaling of $R^2$ instead of $R^3$.

Conventional inferometric imaging devices generally include multiple PIC imager assemblies, which require long hours of labor to mechanically align substrates of the various assemblies. In particular, lenslets can be employed to focus light for reception at a PIC device. High-precision alignment is required to properly position the lenslets with respect to the PIC device. Proper alignment is required for the operation of the imaging device.

In accordance with various aspects of the present disclosure, inferometric imaging systems described herein can utilize flat, thin monolithic pre-aligned collimator arrays and PIC assemblies. Such imaging systems can reduce the size, weight, and power needs as compared to large person-size telescopes and complex combining optics traditionally utilized in space observation equipment. Furthermore, imaging systems described herein significantly reduce the time and cost traditionally required to create conventional collimator arrays and PIC assemblies.

Figure 1:
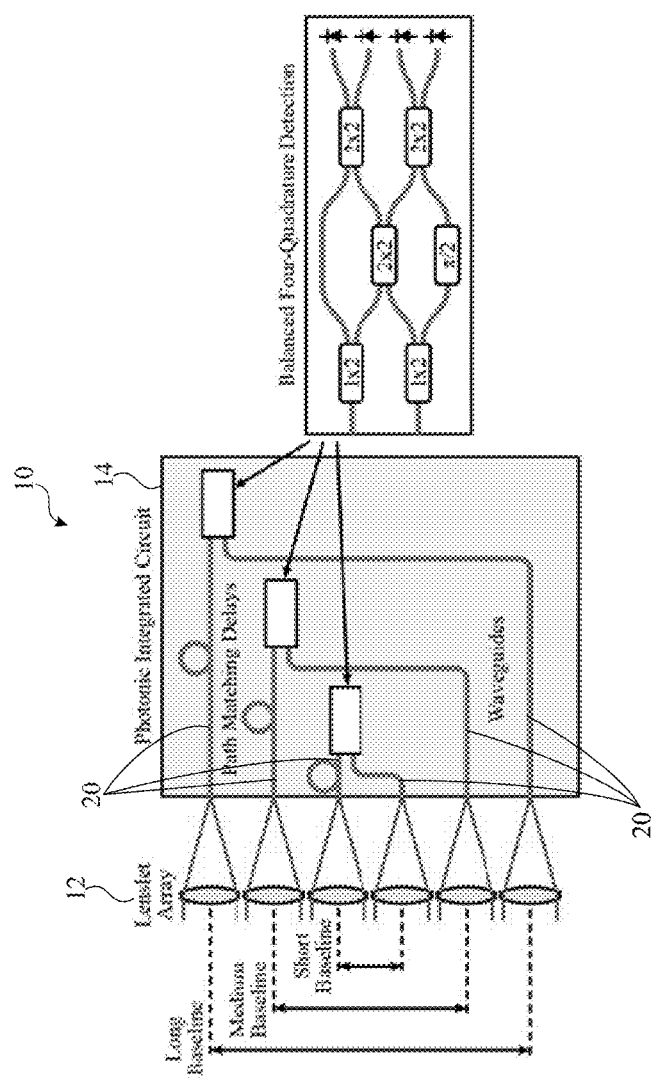
FIG. 1 illustrates a block diagram of an exemplary imaging system.

An optical imaging system can include one or more interferometers. For example, such a system can include multiple interferometers arranged in a preset pattern. FIG. 1 illustrates a diagram of a one-dimensional array 10 of interferometers. The interferometers can comprise a Michelson interferometer. As shown, pairs of lenslets 12 can be combined to form interference fringes one three interferometer baselines. In accordance with some embodiments, each pair of lenslets 12 can provide phase and amplitude for one point in the image u-v frequency plane.

The lenslets 12 can be coupled to a waveguide embedded into a circuit or microchip, such as a PIC device 14. In one or more examples, the PIC device 14 can include path-matching delays and arrayed waveguide gratings for multiple spectral channels 20. The path matching delays can be used to equalize the path lengths between lenslets 12. Further, balanced four quadrature detectors can be used to measure amplitude and phase for each spectral channel. The spectral channels are not illustrated in the figure, but can be placed prior to the path matching delays. Alternatively or in combination, the PIC device 14 can include one or more waveguides, filters, couplers, equalizers, modulators, detectors, and/or converters.

As noted above, in some embodiments, the system can comprise a plurality of interferometers that are arranged in a linear array, as shown in FIG. 1. However, in some embodiments, the interferometers can be arranged in non-linear arrays, two-dimensional patterns, or three-dimensional patterns.

Figure 2:
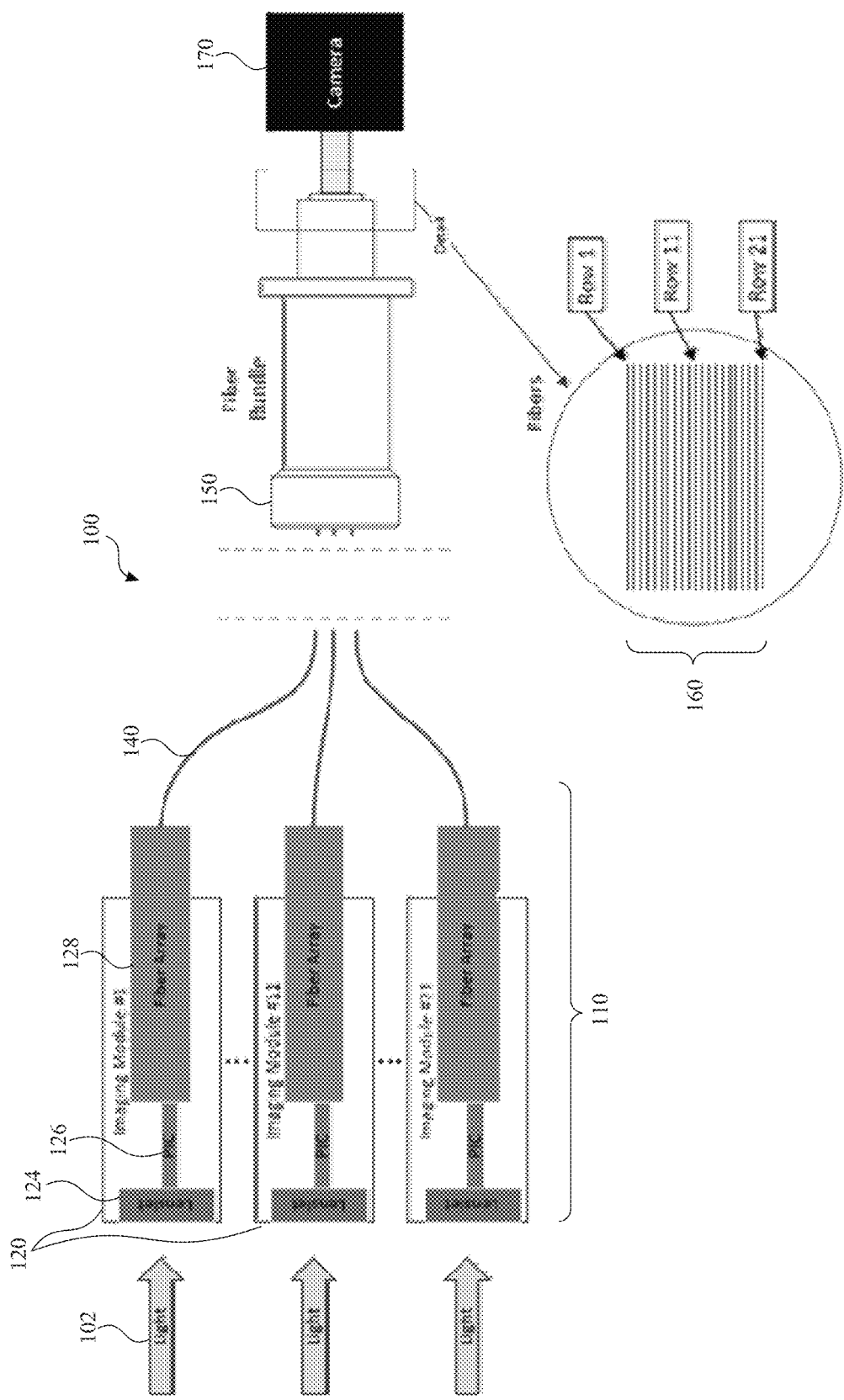
FIG. 2 illustrates a block diagram of an exemplary imaging system.

FIG. 2 illustrates a block diagram of an exemplary imaging system 100. The imaging system 100 can include an imaging assembly 110 with multiple imaging modules 120. Each imaging module includes lenslets 124 and a PIC device 126. The lenslets 124 can be formed in a substrate that is integral with the PIC device 126, as discussed further herein.

Each PIC device 126 can receive light from the lenslets 124 and process the light directed thereto. For example, the PIC devices can each collect light into a two-dimensional array of waveguides. Thereafter, the light can be demultiplexed into several spectral bins. Further, a phase shift can be applied to the light. Additionally, the light can be coherently combined into baseline pairs. In some embodiments, the combining can also comprise accounting for separation differences between lenslets. Furthermore, the PIC devices 126 can also be configured to perform photo detection of complex fringe patterns. Various material platforms can be used for performing optical processing operations with integrated photonic devices. Such materials can comprise, e.g., indium phosphide (InP), silicon (Si), silica (SiO2), silicon oxynitride (SiOxNy), and other suitable materials.

The PIC device 126 is configured to generate signals that are communicated along multiple fiber arrays 128. The fiber arrays 128 can include optic fibers that direct photons. Each of the fiber arrays 128 is connected to corresponding one of the multiple imaging modules 120. In particular, each fiber array 128 connects a corresponding PIC device 126 to a camera device 170. For example, each fiber array 128 connects to a lead 140, with multiple leads 140 being gathered together in a fiber bundle 150. The camera device 170 is connected to the imaging modules 120 and configured to detect a signal (e.g., photons) from each of the multiple imaging modules 120 via the fiber arrays 128, leads 140, and/or fiber bundle 150. Each of the fibers of the fiber bundle 150 can be arranged in rows 160 for connection to the camera device 170 via an interface thereof. Multiple fibers of a given row 160 can correspond to a single one of the multiple imaging modules 120, with a total number of rows corresponding to a total number of imaging modules 120. It will be appreciated that any number of imaging modules 120 can be provided, with each of a corresponding number of fiber arrays 128 connecting to each of the imaging modules 120 and to the camera system 170.

Figure 3:
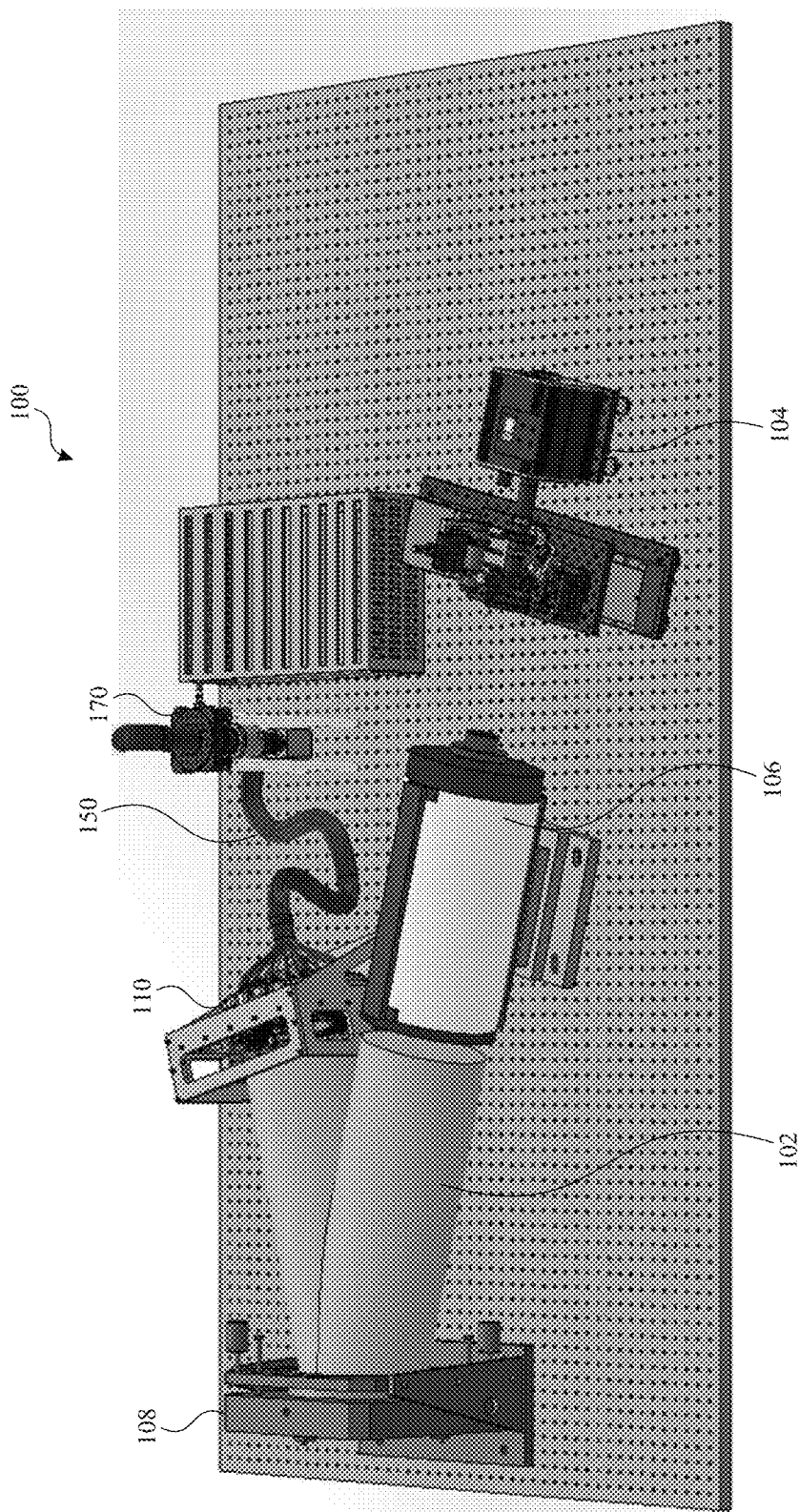
FIG. 3 illustrates a perspective view of an exemplary imaging system.

FIG. 3 illustrates a perspective view of an exemplary imaging system 100. While the arrangement shown in FIG. 3 is presented as a laboratory setup capable of testing the imaging system 100, it will be appreciated that some or all of the components of the imaging system 100 can be arranged in other configurations, such as a sensor for a spacecraft. The imaging system 100 can include the imaging assembly 110 that receives incoming light 102 and provides an output via the fiber bundle 150 to the camera system 170. In a laboratory setting, the incoming light 102 can be provided by a scene generator 104, a telescope 106, and/or a mirror 108. It will be appreciated that incoming light can be from any source for which observation is desired.

Figure 5:
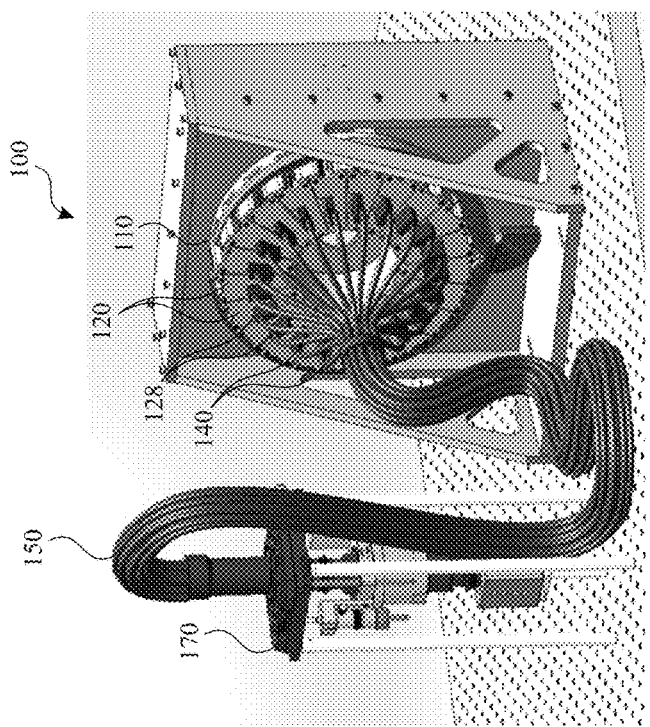
FIG. 5 illustrates a perspective view of a portion of the imaging system of FIG. 3.
Figure 4:
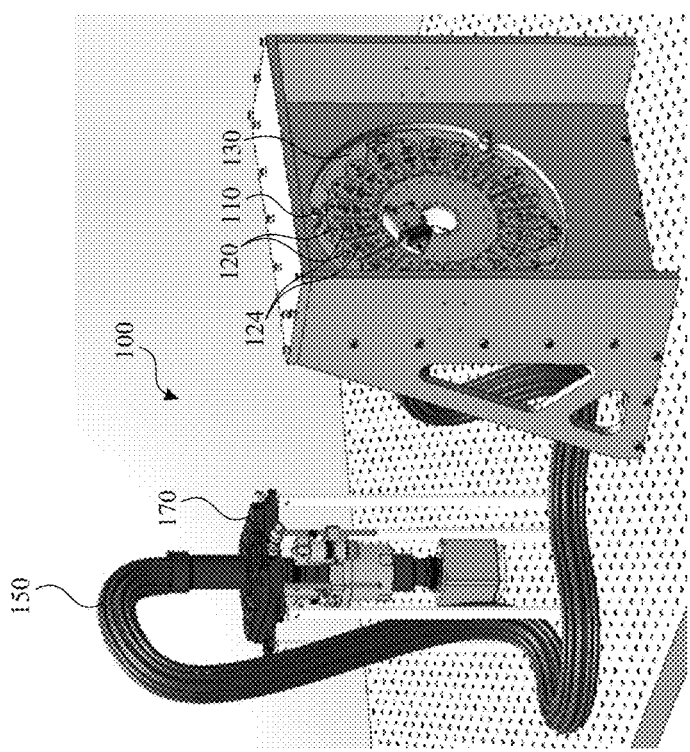
FIG. 4 illustrates a perspective view of a portion of the imaging system of FIG. 3.

FIGS. 4 and 5 illustrate perspective views of a portion of the imaging system 100. As shown in FIG. 4, the imaging assembly 110 can include a support structure 130 onto which each of the imaging modules 120 is removably and exchangeably coupled. For example, each imaging module 120 can be integrally made with both the lenslets 124 and the PIC device 126 prior to coupling to the support structure 130. For example, the lenslets 124 and the substrates thereof can each be integrally and/or monolithically bonded to the corresponding PIC device 126. The bonding can be accomplished using an active alignment to ensure ideal coupling into the fibers, followed by bonding. As such, alignment between the lenslets 124 and the PIC device 126 is complete and durably fixed prior to assembly with the support structure 130. As modules, the imaging modules 120 can be coupled to and removed from the support structure 130 as desired. The support structure 130 can provide an interface for connecting and retaining the imaging modules 120.

When coupled, the imaging modules 120 are aligned with respect to the support structure 130 in a desired position and orientation. The support structure 130 can include a generally cylindrical shape, and the imaging modules 120 can be oriented in a plurality of rows extending radially outwardly along the support structure 130. Further, the plurality of rows can be substantially linear. The corresponding PIC devices can be positioned with respective edges thereof along the focal plane and in optical communication with the plurality of rows of the lenslets 124. The lenslets 124 of the multiple imaging modules 120 can be arranged in a common plane, and the imaging modules 120 can be coupled to the support structure 130 in another common plane.

The array of imaging modules 120 is coupled onto a focal plane of the support structure 130 and constrained by the array. The constraining done based on consideration of critical tolerances of each of the components of the array and PIC assemblies and building this into the assembly process. In this way, tedious manual alignment processes are eliminated for each of the assemblies utilized. The imaging modules 120 are thus constrained in many critical dimensions and assembly becomes as simple as plugging "arms" into an arrangement, instead of manually aligning each of the imaging modules 120 as well as the components thereof. Such alignment has large technical challenges that are addressed by providing a method of manufacture that includes (1) integrating lenslets 124 and the PIC device 126 to micron precision as, for example, a monolithic collimator array, (2) assimilating the integrated imaging modules 120 into a larger assembly (i.e., imaging assembly 110) coupled to fiber arrays 128 (e.g., waveguide arrays), and (3) assimilating the single assembly of a fiber coupled imager (i.e. the waveguide coupled to the integrated lens and PIC assembly) into an even larger array of multiple imaging assemblies 110. The aforementioned configuration provides the advantage of coupling the assemblies into a single focal plane, thereby simplifying mechanical assembly and removing hours upon hours of extremely precision-based technical work by absorbing the precision (taking into account all critical tolerances to tightly align the assemblies and components thereof) into the manufacturing process and providing a path to efficiently manufacturing the imaging system 100. Various aspects thereof can be applied to a low SWaP imager, or any applications sending devices to space or looking for lightweight imaging on the ground or in the air.

As shown in FIG. 5, each of the fiber arrays 128 is removably connected to corresponding one of the multiple imaging modules 120. In particular, each fiber array 128 connects a corresponding PIC device 126 to the camera system 170. The fiber arrays 128 can connect to the imaging modules 120 while the imaging modules 120 are coupled to the support structure 130. The imaging modules 120 and/or the support structure 130 can provide an interface for connecting and retaining the fiber arrays 128.

Figure 6:
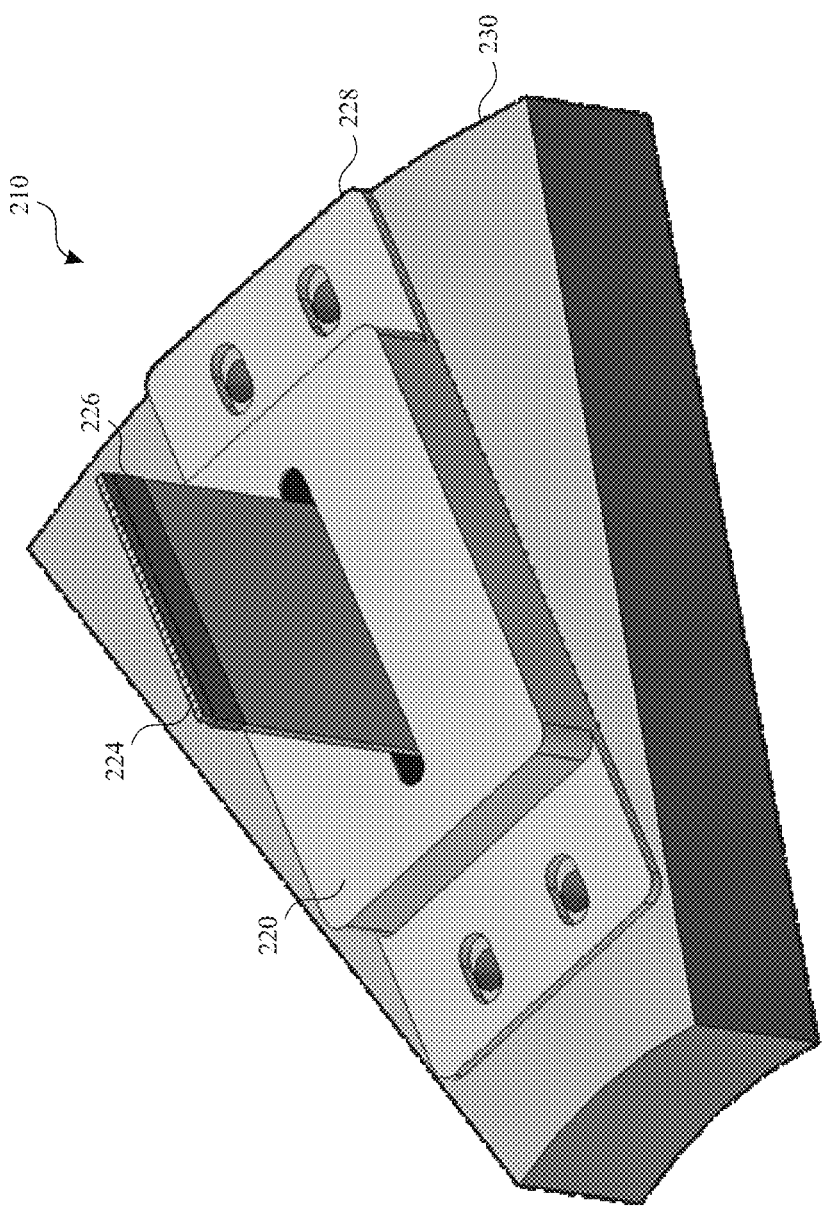
FIG. 6 illustrates a perspective view of an exemplary imaging assembly.

FIG. 6 illustrates a perspective view of an exemplary imaging assembly 210. The imaging assembly 210 can include a support structure 230 onto which each of the imaging modules 220 is removably and exchangeably coupled. For example, each imaging module 220 can be integrally made with both the lenslets 224 and the PIC device 226 prior to coupling to the support structure 230. For example, the lenslets 224 and the substrates thereof can each be integrally and/or monolithically bonded to the corresponding PIC device 226. As such, alignment between the lenslets 224 and the PIC device 226 is complete and durably fixed prior to assembly with the support structure 230. A portion of the imaging assembly 210 can define a coupling member 228 that interfaces with and couples to the support structure 230. When the coupling member 228 is coupled to the support structure 230, the imaging modules 220 are aligned with respect to the support structure 230 in a desired position and orientation. The lenslets 224 of the multiple imaging modules 220 can be arranged in a common plane, and the imaging modules 220 can be coupled to the support structure 230 in another common plane.

Figure 8:
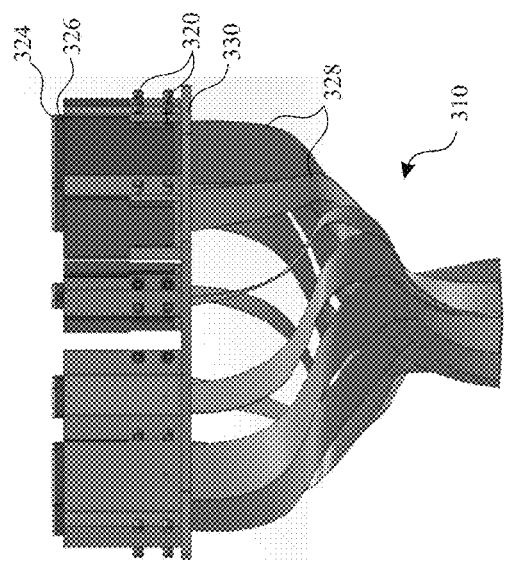
FIG. 8 illustrates a side view of the imaging assembly of FIG. 7.
Figure 9:
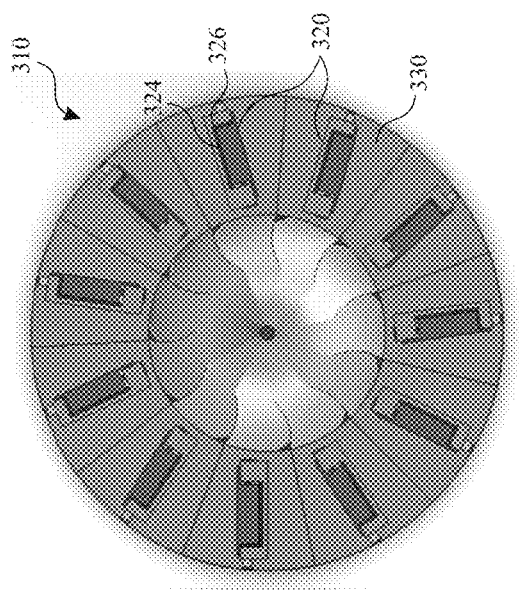
FIG. 9 illustrates a top view of the imaging assembly of FIGS. 7 and 8.
Figure 7:
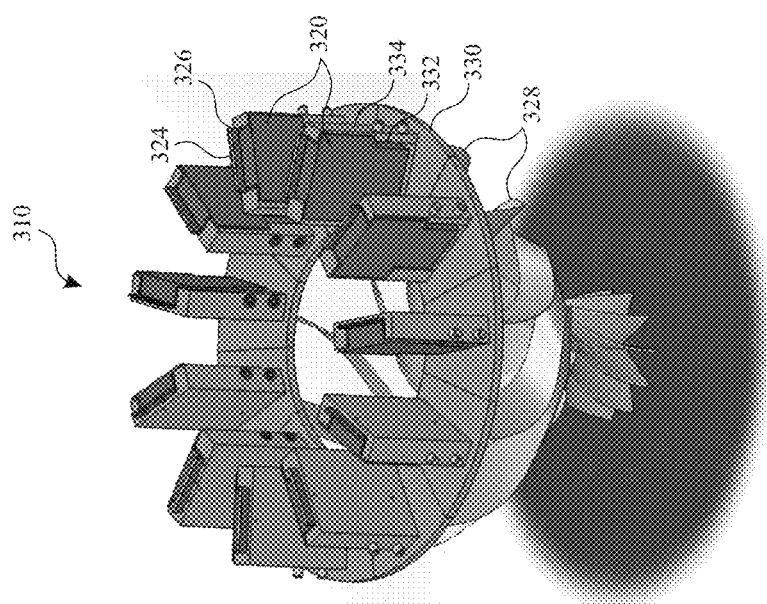
FIG. 7 illustrates a perspective view of an exemplary imaging assembly.

FIGS. 7-9 illustrate perspective, side, and top views of an exemplary imaging assembly 310. The imaging assembly 310 can include a support structure 330 onto which each of the imaging modules 320 is removably and exchangeably coupled. For example, each imaging module 320 can be integrally made with both the lenslets 324 and the PIC device 326 prior to coupling to the support structure 330. For example, the lenslets 324 and the substrates thereof can each be integrally and/or monolithically bonded to the corresponding PIC device 326. As such, alignment between the lenslets 324 and the PIC device 326 is complete and durably fixed prior to assembly with the support structure 330. The support structure 330 can provide an interface for connecting and retaining the imaging modules 320. At least a portion of the imaging module 320 can fit within a receptacle 332 of the support structure 230 and be secured therein. For example, the receptacles 332 can be defined within an extension member 334 extending from a planar surface of the support structure 330. When the imaging modules 320 are coupled to the support structure 330, the imaging modules 320 are aligned with respect to the support structure 330 in a desired position and orientation. The lenslets 324 of the multiple imaging modules 320 can be arranged in a common plane, and the imaging modules 320 can be coupled to the support structure 330 in another common plane. Each imaging module 320 connects to a fiber array 328. The imaging modules 320 and/or the support structure 330 can provide an interface for connecting and retaining the fiber arrays 328.

Figure 10:
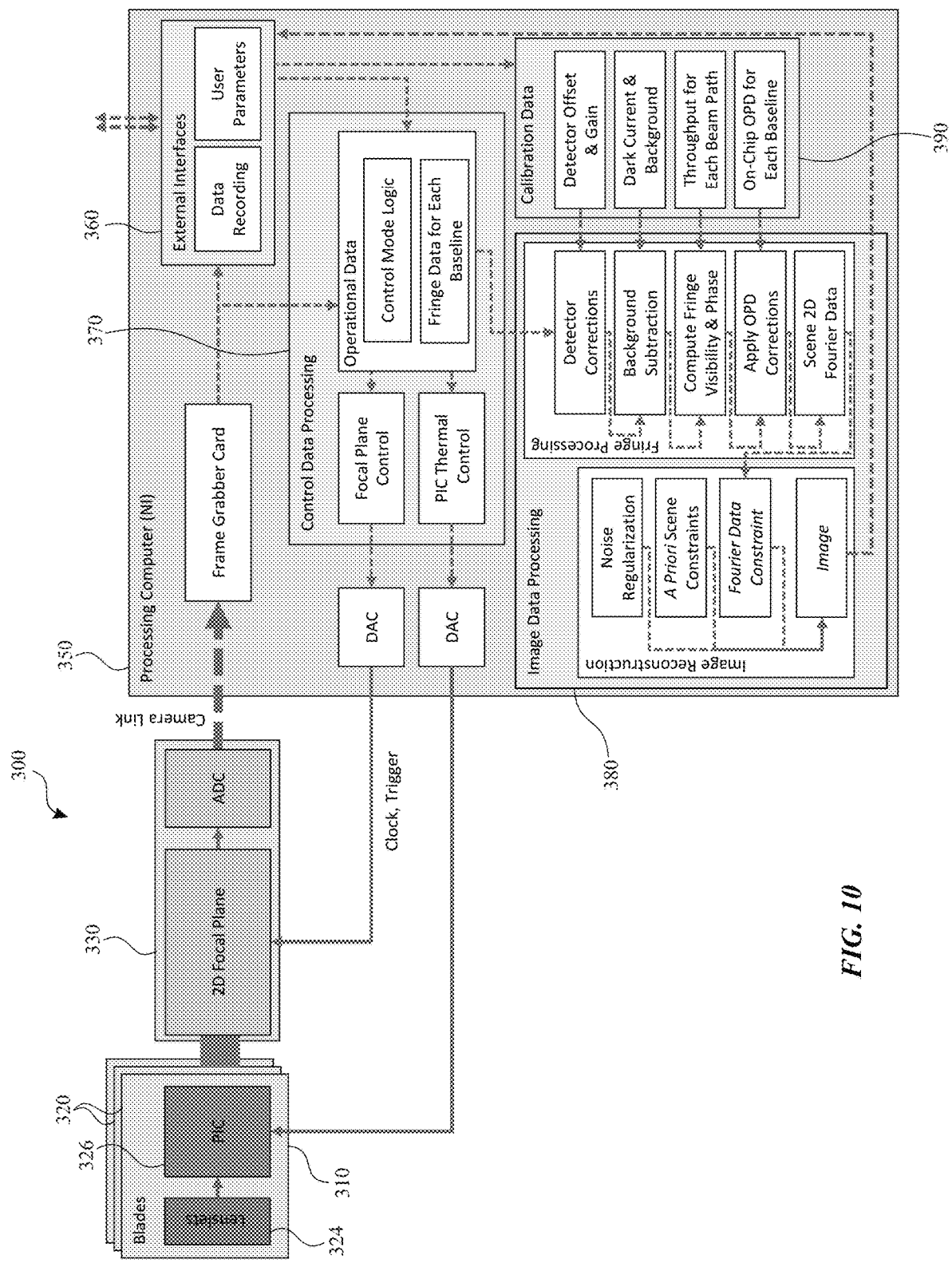
FIG. 10 illustrates a block diagram of an exemplary imaging system.

FIG. 10 illustrates a block diagram of an exemplary imaging system that includes the imaging assembly 310. As shown, the imaging modules 320 can communicate with one or more processing modules for processing information provided by the imaging modules 320 and/or controlling operation of the imaging modules 320. The support structure 330 can include an analog-to-digital converter for converting analog signals from the imaging modules 320 to digital signals for use by the processing computer 350. The processing computer 350 can further include a frame grabber for capturing images based on the signal from the imaging modules 320. An external interface module 360 of the processing computer 350 can provide user interface capabilities, such as recording and displaying data and receiving, storing, and applying user parameters. A control module 370 of the processing computer 350 can provide control capabilities, such as applying control mode logic, control of the focal plane, and control based on thermal conditions. Communications lines can be provided as needed between the control module 370 and components of the imaging modules 320, including the PIC device 326, and/or the support structure 330, including the focal plane. Such connections can include digital-to-analog converters for converting digital signals from the processing computer 350 to digital signals for use by the imaging modules 320 and/or the support structure 330.

The control module 370 can incorporate fringe data for each baseline. For example, light from a pair of waveguides from lenslets that form an interferometer pair can be demultiplexed into wavelength bins and combined with appropriate phase shifts to enable a measurement of the complex visibility. Each waveguide can collect light from a field point in the scene and common points in the scene from pairs of lenslets can be combined to create fringes (e.g., in a balanced four-quadrature receiver). The phase and amplitude can be recorded for each field point and each lenslet pair which form a baseline. The data can be placed in the u-v plane array at the proper location in order to reconstruct the scene that is being imaged. Each wavelength bin can provide a unique spatial frequency to further fill the u-v plane. The complex visibilities from all the measurements can be processed then to form an image.

A calibration module 390 of the processing computer 350 can receive and incorporate data calibration inputs, including detector offset and gain, dark current and background, throughput for each beam path, and/or on-chip OPD for each baseline. An image processing module 380 of the processing computer 350 can perform image processing, including fringe processing and image reconstruction. Fringe processing can include detector corrections (i.e., based on detector offset and gain), background subtraction (i.e., based on dark current and background), computing fringe visibility and phase (i.e., based on throughput for each beam path), applying OPD corrections (i.e., based on on-chip OPD for each baseline), and generating scene 3D Fourier data. Image reconstruction can include noise regularization, applying a priori scene constraints, applying Fourier data constraint (i.e., based on scene 3D Fourier data), and generating an image.

Figure 11:
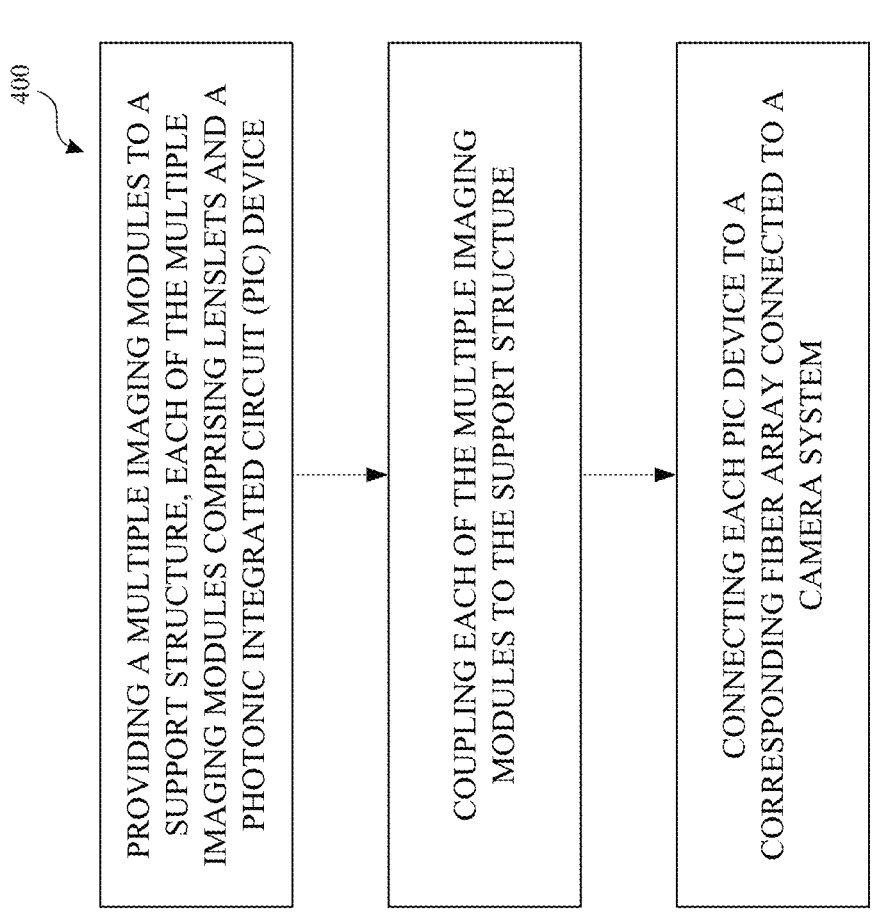
FIG. 11 illustrates a flowchart of an exemplary method for manufacturing an imaging system.

FIG. 11 illustrates a flowchart of an exemplary method 400 for manufacturing an imaging system, such as those described herein (e.g., imaging system 100, imaging system 200, or imaging system 300). Multiple imaging modules can be provided to a support structure, with each of the multiple imaging modules including lenslets and a PIC device. The lenslets of each of the multiple imaging modules can be previously formed in a substrate that is integral with the corresponding PIC device. Each of the multiple imaging modules can be coupled to the support structure. Each PIC device can be connected to a corresponding fiber array that is connected to a camera system.

Figure 12:
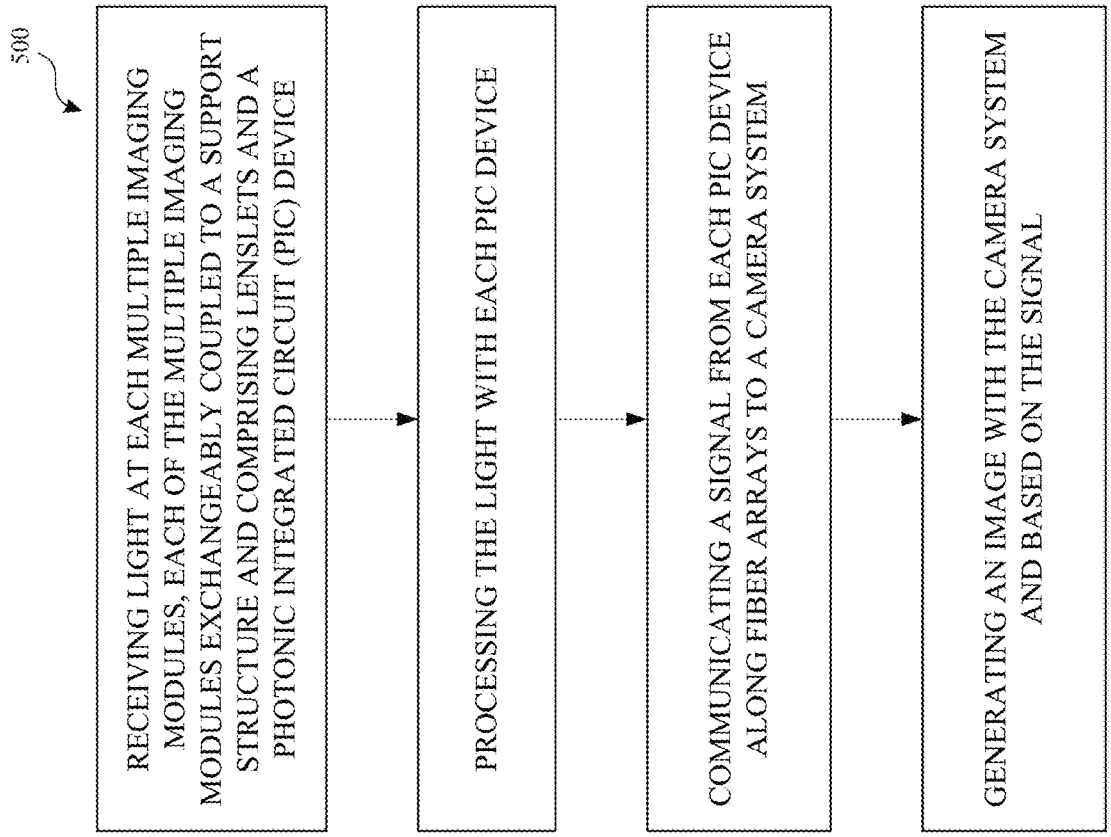
FIG. 12 illustrates a flowchart of an exemplary method for operating an imaging system.

FIG. 12 illustrates a flowchart of an exemplary method 500 for operating an imaging system, such as those described herein (e.g., imaging system 100, imaging system 200, or imaging system 300). Light is received at lenslets of each of multiple imaging modules. Each of the multiple imaging modules can be exchangeably coupled to a support structure and include the lenslets and a PIC device. The light can be processed with each PIC device. A signal can be communicated from each PIC device along fiber arrays to a camera system. The camera system can generate an image based on the signal.

In accordance with some embodiments, the systems described herein can function as or replace a traditional optical telescope and digital focal plane detector array with a densely packed interferometer array based on emerging PIC technologies that sample the object being imaged in the Fourier domain, i.e., spatial frequency domain, and then reconstructs an image. When compared to traditional large optics and structures required by conventional telescopes, such embodiments can advantageously provide more compact assemblies that can incorporate PIC devices accommodated by standard lithographic fabrication techniques, e.g., CMOS fabrication. The standard eletro-oprical (EO) payload integration and test process, which involves precision alignment and test of optical components to form a diffraction limited telescope, therefore, can be replaced by in-process integration and tested as part of the PIC fabrication that substantially reduces associated schedule and cost.

Additionally, the systems described herein can include an EO sensor. The EO sensor can comprise millions of direct-detect white-light interferometers to measure the amplitude and phase of the visibility function at spatial frequencies that span the full synthetic aperture of the telescope. The conventional approach for imaging interferometers, such as the Naval Prototype Optical Interferometer (NPOI) at Flagstaff, requires complex mechanical delay lines to form the interference fringes resulting in designs that are not traceable to more than a few simultaneous spatial frequency measurements.

In contrast, the systems described herein can achieve this traceability by employing sub-micron-scale waveguides or nano-photonic switches. Further, in accordance with some embodiments, the sub-micron-scale waveguides or nano-photonic switches can be fabricated in one or more silicon microchips having micron-scale packing density to form the delay lines and beam combiners.

The systems described herein can utilize nanophotonics and MEMs technology to provide applications that involve collecting photons from external sources and processing them on a PIC card to form computational images rather than the traditional approach that directly forms an image on a digital focal plane with a large, bulky optical telescope. As such, some embodiments present an exciting and revolutionary advancements in the field that can have substantial impact on future space-based sensors. As a further advantage, some embodiments can be implemented to provide space surveillance sensors in a cost and schedule constrained environment. Additionally, some embodiments disclosed herein provide a revolutionary electro-optical (EO) sensor that is a compact alternative to the traditional EO imaging sensor by dramatically reducing size, weight, power, schedule, and integration and test complexity through the elimination of the manufacture, polishing, and alignment of the large optics required by conventional EO sensors.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language of the claims and to encompass all legal equivalents. Notwithstanding, none of the claims are intended to embrace subject matter that fails to satisfy the requirements of the applicable patent law, nor should they be interpreted in such a way.

What is claimed is:

1. An imaging system comprising:
   a support structure;
   multiple imaging modules exchangeably coupled to the support structure and each comprising:
   lenslets; and
   a photonic integrated circuit (PIC) device that is monolithically formed with the lenslets and arranged to receive light from the lenslets;
   multiple fiber arrays each connected to corresponding one of the multiple imaging modules, the fiber arrays being arranged in rows of a fiber bundle, wherein each row of the fiber bundle corresponds to a single one of the fiber arrays connected to a corresponding one of the imaging modules; and
   a camera system connected to the fiber bundle and configured to detect a signal from each of the multiple imaging modules via a corresponding one of the rows of the fiber bundle.

2. The imaging system of claim 1, wherein at least a portion of each of the imaging modules is positioned within a corresponding receptacle of the support structure.

3. The imaging system of claim 2, wherein each receptacle is defined within a corresponding extension member extending from a planar surface of the support structure.

4. The imaging system of claim 3, wherein each of the multiple fiber arrays extends through the planar surface.

5. The imaging system of claim 1, wherein the lenslets of the multiple imaging modules are arranged in a common plane.

6. The imaging system of claim 1, wherein the multiple imaging modules are coupled to the support structure in a common plane.

7. The imaging system of claim 1, wherein the lenslets of each of the multiple imaging modules are formed in a substrate that is integral with a corresponding one of the PIC devices.

8. The imaging system of claim 1, wherein the support structure comprises a converter for converting an analog signal from each PIC device to a digital signal.

9. A method of manufacturing an imaging system, the method comprising;
   providing a multiple imaging modules to a support structure, each of the multiple imaging modules comprising:
   lenslets; and
   a photonic integrated circuit (PIC) device that is monolithically formed with the lenslets;
   coupling each of the multiple imaging modules to the support structure; and
   connecting each PIC device to a corresponding fiber array connected to a camera system by arranging each fiber array in a corresponding row of a fiber bundle attached to the camera system such that each row of the fiber bundle corresponds to a single fiber array connected to a corresponding one of the imaging modules.

10. The method of claim 9, wherein connecting each of the multiple imaging modules to the support structure comprises arranging the lenslets of the multiple imaging modules in a common plane.

11. The method of claim 9, wherein connecting each of the multiple imaging modules to the support structure comprises arranging the lenslets of the multiple imaging modules in a common plane.

12. The method of claim 9, further comprising, prior to the coupling, forming the lenslets of each of the multiple imaging modules in a substrate that is integral with a corresponding PIC device.

13. The method of claim 9, wherein the coupling comprises securing each of the multiple imaging modules within a corresponding receptacle defined within an extension member extending from a planar surface of the support structure.

14. The method of claim 13, wherein the connecting comprises positioning each fiber array through the planar surface.

15. A method of processing images with an imaging system, the method comprising:
   receiving light at each of multiple imaging modules, each of the multiple imaging modules exchangeably coupled to a support structure and comprising lenslets and a photonic integrated circuit (PIC) device that is monolithically formed with the lenslets;
   processing the light with each PIC device;
   communicating a signal from each PIC device along fiber arrays to a camera system, the fiber arrays being arranged in rows of a fiber bundle attached to the camera system, wherein each of the row of the fiber bundler corresponds to a single one of the fiber arrays connected to a corresponding one of the imaging modules; and
   generating an image with the camera system and based on the signal.

16. The method claim 15, further comprising converting an analog signal from each PIC device to a digital signal with a converter of the support structure.

17. The method claim 15, wherein the receiving comprises receiving the light through the lenslets, wherein the lenslets of each of the multiple imaging modules are formed in a substrate that is integral with a corresponding PIC device.

18. The method claim 15, wherein the receiving comprises receiving the light through the lenslets arranged in a common plane.

* * * * *